(12) United States Patent
Tuan

(10) Patent No.: US 9,262,571 B2
(45) Date of Patent: Feb. 16, 2016

(54) LAYOUT MIGRATION WITH HIERARCHICAL SCALE AND BIAS METHOD

(71) Applicant: G-Analog Design Automation Limited, Hsinchu (TW)

(72) Inventor: Jeh-Fu Tuan, San Jose, CA (US)

(73) Assignee: G-Analog Design Automation Limited, Hsinchu (TW)

(*) Notice: Subject to any disclaimer, the term of this patent is extended or adjusted under 35 U.S.C. 154(b) by 0 days.

(21) Appl. No.: 13/923,256

(22) Filed: Jun. 20, 2013

(65) Prior Publication Data

US 2014/0380259 A1    Dec. 25, 2014

(51) Int. Cl.
*G06F 17/50* (2006.01)

(52) U.S. Cl.
CPC .................. *G06F 17/5072* (2013.01)

(58) Field of Classification Search
CPC . G06F 17/5068; G06F 17/50; G06F 17/5045; G06F 17/5081; G06F 17/5036; G06F 17/505
USPC .......................................... 716/103, 118, 119
See application file for complete search history.

(56) References Cited

U.S. PATENT DOCUMENTS

| | | | |
|---|---|---|---|
| 5,640,497 A | 6/1997 | Woolbright | |
| 8,352,899 B1 | 1/2013 | Yap et al. | |
| 8,607,182 B2 | 12/2013 | Chen et al. | |
| 8,745,554 B2 | 6/2014 | Cheng et al. | |
| 2008/0134109 A1* | 6/2008 | Hammouda et al. | 716/3 |
| 2012/0233576 A1* | 9/2012 | Barrows et al. | 716/103 |
| 2013/0019219 A1 | 1/2013 | Chen et al. | |

* cited by examiner

*Primary Examiner* — Vuthe Siek
(74) *Attorney, Agent, or Firm* — Edward C. Kwok; Steven P. Chen; Hogan Lovells US LLP

(57) ABSTRACT

A method for migrating a hierarchical layout between manufacturing processes is accomplished without specification of a technology file and design rules. Different scaling factors and bias values in the X and Y directions may be applied to each layer in the source hierarchical layout during the migration. In addition, the target hierarchical layout maintains connectivity, and is free of notches, jogs and small edges. A cell hierarchy tree is created, which guides expansion of the target hierarchical database to resolve issues related to rounding of floating point numbers to integers. Boolean operations are performed to determine the differences between target flat database and the target hierarchical database. The differences are eliminated by modifying the target hierarchical database to match the layout in the flat database.

26 Claims, 10 Drawing Sheets

SCALE_X=0.7
SCALE_Y=0.7

SCALE_X=1.0
SCALE_Y=0.5

SCALE_X=0.5
SCALE_Y=0.5
SIZE_SCALE=0.5

LAYOUT MIGRATION WITH HIERARCHICAL SCALE AND BIAS METHOD

BACKGROUND OF THE INVENTION

1. Field of the Invention

The present invention relates to integrated circuits; in particular, the present invention relates to "scale and bias" layout migration methods used to adapt a layout of an existing integrated circuit that is designed for fabrication by one manufacturing process to another, typically more advanced, manufacturing process.

2. Discussion of the Related Art

In the integrated circuit (IC) industry, a circuit design and its corresponding "layout" (i.e., the physical implementation[1]) are often migrated from one fabrication process to a different, often more advanced, fabrication process. When a layout is migrated to a newer fabrication process, the physical dimensions in the layout are scaled down to achieve a smaller "chip size" or footprint and better performance. The well-known Moore's law predicts a doubling of IC performance every 18 months. At the same time, the size of an IC chip for a given complexity would also decrease, as a result of advance in process technology. As more advanced processes use smaller feature sizes, a layout targeted for fabrication in one process may be re-targeted for fabrication in a newer or different process. The designer typically prefers to reuse an existing layout as much as possible, rather than having to redesign the layout from "scratch," for time-to-market considerations, as the integrated circuit industry is under intense competition.

[1] A layout database that represents a layout is typically organized by layers, with each layer representing the image of a photo-lithographical mask. The image of each layer consists of a number of polygons that define areas through which light is allowed to pass or is occluded. The term "geometries" are also colloquially used for the polygons. In this description, the term "polygon" is used throughout interchangeably with the term "geometry."

In digital circuits, advanced development in computer-aided-design (CAD) tools and the cell-based design methodology made possible extensive reuse of cell-based digital designs. In contrast, for custom circuit designs (i.e., designs that do not follow a cell-based design methodology), CAD tools still require significant amount of manual intervention. Often, custom circuit designers have to rely on their past experience and expertise to achieve a desired performance. Migrating a custom design to a new fabrication process, or to a new design specification, often involves manual redrawing of many parts—if not all—of the layouts. Naturally, such a process is both time consuming and tedious. Therefore, a methodology for automatically migrating a layout to a new fabrication process or a new design specification is important, especially in light of design and turn-around times reduction considerations.

In migrating a layout between fabrication processes, "scale and bias" is a technique that is often used. The technique is used, for example, in the lambda design rule system, which is part of the original VLSI design flow proposed by Mead and Conway more than 30 years ago. In the lambda design rule system, any feature in the layout can naturally be scaled and biased from one fabrication process to another sufficiently similar fabrication process. The technique relies on the assumption that all geometry in the layout scale proportionally. However, this assumption is valid only when the two fabrication processes are sufficiently similar, and when the design rules are conservative and not optimized. The resulting scaled layout typically requires a larger silicon area than is desirable, as some techniques used in the original process may not be able to take advantage of minimum size or spacing for some features or elements in the target process. Over time, the lambda design rule system is replaced by a more complicated "micron design rule system" which uses in the layout database the actual dimensions in the design rules for the target fabrication process.

Historically, influenced by Moore's law, successively generations of fabrication processes typically reduce area requirements by one-half. This reduction means that the X and Y dimensions are each reduced by around 30% or, essentially, a scaling factor of about 0.7. Often, a fabrication process of intermediate dimensions may also be provided. In that case, the generational process would be known as a "full node" process, while the intermediate dimension fabrication process is known as a "half node" process. Other than the difference in feature dimensions, the half node process is often a minor variation of the full node process. Under the scale and bias technique, a layout may be scaled from a "full node process" to a "half node" process through a proportional reduction that can be performed substantially automatically by computer during preparation of the photo-lithographical masks. For example, the 45 nm process is a full node process and 40 nm process is a half node process. The layout can be migrated from 45 nm to 40 nm through a "90% shrink." The same reduction procedure can be performed for migrations from a 32 nm process to a 28 nm process and from a 22 nm process to a 20 nm process.

To illustrate a layout migration process, for a database resolution of 1 nm and a design grid unit of 1 nm, an edge in a polygon that is 23 units long is scaled to 20.7 units. For computational reasons, all stored dimensions in a layout database are typically expressed in integers. Therefore, in this example, the scaled edge is rounded to 21 units long, thus losing 0.3 units of accuracy. If the database resolution is decreased from 1 nm to 0.1 nm, then the scaled edge may be expressed as 207 units long at a 0.1 nm resolution, without loss of accuracy. In fact, it is typical that the manufacturing database has 10 times the resolution of the design database in anticipation of support for the shrink conversion to the half-node process. The 10 times resolution readily supports single significant digit scaling factors, such as 0.9, 0.8 or 0.7. To support two significant digit scaling factors, such as 0.75 or 0.71, the resolution in the manufacturing database needs to be two orders of magnitude greater than that of the design database. For this reason, the most frequently used scaling factor in the manufacturing database is 0.9, for approximately a 20% area reduction.

The scale and bias technique can only be applied to a "flat" database, however. The flat database is much larger than a hierarchical database, which is typically the form that is used for design. The flat database is not suitable for design use because of its size and also because modifying the layout in a flat database is difficult. If scaling is attempted in a hierarchical database, however, rounding errors may create connectivity problems, notches, jogs and small edges. Connectivity problems are detected in a layout versus schematic (LVS) check. Notches, jogs and small edges may be detected at a design rule check (DRC). For small blocks, such errors are few and manageable, and can be manually corrected. Correcting such errors is quite tedious and time consuming, nevertheless. For a medium to large circuit, the number of such errors may be prohibitively large for manual correction.

Conventional layout scaling requires the same scaling factor in both X and Y directions. In an advanced MOS fabrication process, circuit layout rules are driven by photo-lithographical limitations. One of the most important constraints is gate pitch, which is the center-to-center distance between the gates of two adjacent transistors. In an advanced process, the gates of neighboring transistors are required to have the same pitch or separation distance and further, such separation distance must be one of a limited number of pitches. Typically, all transistor gates are required to be aligned in the same direction. Such a requirement dictates the scaling factor applicable to the direction that is perpendicular to the alignment direction of the transistor gates. For example, if all gates of the transistors are aligned in the X direction, a fixed pitch is required between the gates in the Y direction. If the original process requires a gate pitch of 120 nm and the new process requires a gate pitch of 90 nm, then the scaling factor for the Y direction is 0.75. At the same time, if the transistor gates are aligned in the X direction, the transistor width after migration is determined by the X direction scaling factor. This scaling factor is significant, as the width of an MOS transistor is an important parameter that determines MOS circuit performance. Ideally, therefore, although the transistor gate pitch scaling factor (in this case the Y direction scaling factor) is determined by the process technology, the X direction scaling factor is determined by both process technology and design performance specifications. Thus, in most cases, the desired X and Y scaling factors are different. The different desired X and Y scaling factors make a traditional scale and bias method—which use the same X and Y scaling factors—ineffective for migrating real circuit design and layout.

Bias operations (i.e., growing or shrinking specific elements) are typically applied after the X and Y direction scaling operations are performed. The bias operations further refine the migration process to meet the requirements of the target process. In a lambda design rule system, all dimensions and design rules are scaled proportionally, which is not true of micron design rule systems that are used in practically almost all designs today. In a micron design rule system, although the design rules typically do not scale proportionally, the elements are scaled close to proportionality in general, so as to track an overall geometry shrinking scale. If the overall scaling for a given process is 70%, most dimensions and design rules would preferably be scaled around 70%. Consider a feature in the original layout measuring 90 nm in the X dimension. If the applicable scaling factor is 0.7, the resulting X dimension feature would be 63 nm after scaling. However, if the new design rule requires such a feature to be 65 nm, a bias operation is required to extend the feature by 2 nm, e.g., extending by 1 nm on each side in the X direction, in order to meet the new design rule. It is also often desirable to have different bias conditions in the X and Y directions. As scaling factors in the X and Y directions may be different, a square contact or via may become rectangular with unequal sides after scaling. Separate X and Y bias operations may be required to grow or shrink the migrated contact or via back to a square.

Most layout migration algorithms are based on layout compaction, which is a process that preserves the topology of the source layout. Typically, the user provides a technology file which describes the design rules of the target process. Since design rules have become very complicated for the advanced process, not all design rules can be coded into the technology file. In fact, for efficiency reason, often the basic design rules are the only ones coded in the technology file. Typically, the source layout is analyzed and each design rule is used as a constraint on all applicable elements in the layout. A reasonably optimized layout that satisfies these constraints can be obtained only by linear programming (LP) or graph-based algorithms. For a large layout, and as design rules have become increasingly complicated, even writing a technology file is a daunting task. Even a small block in a layout can result in applications of millions of constraints. Thus, even using linear programming or sophisticated techniques, the number of constraints and variables result in prohibitively long total runtime in a layout migration. Due to resource constraints, compaction algorithms are useful only on small circuits. As not all design rules can be coded into a technology file, manual corrections are inevitable for a complete layout migration. For medium to large circuits, the source layouts are divided into blocks and are migrated separately. The migrated blocks are subsequently integrated at the top-level. Even this top-level integration is not straightforward, as the operation may require further modifications of the already migrated lower-level blocks.

As a result, existing layout migration does not provide a complete solution, as the current methods can only work with a small block at a time and require integration of the migrated blocks.

Therefore, what is needed is a systematic approach to allow migration of entire layouts to new fabrication processes. Since existing layout migration tools can migrate only small, lower-level blocks efficiently, what is needed is a tool that can migrate the entire circuit efficiently, so as to eliminate the need for subsequent top-level integration. This approach must ensure that the migrated layout satisfies basic layout requirements, such as correct connectivity, transistor pitches, transistor gate lengths, metal widths, and contact or via sizes. The migrated circuit and layout should also satisfy a first-pass circuit performance requirement before further optimization is required. Such a migrated layout should be able to serve as a framework for lower-level block migrations using existing migration tools.

U.S. Pat. No. 5,640,497, entitled "LAYOUT REDESIGN USING POLYGON MANIPULATION" and U.S. Pat. No. 8,352,899, entitled "METHOD TO MODIFY AN INTEGRATED CIRCUIT (IC) DESIGN" each disclose layout modification. Other layout migration methods are disclosed, for example, in (a) U.S. Patent Application 20120304139, entitled "METHOD OF FAST ANALOG LAYOUT MIGRATION," (b) U.S. Patent Application 20110161907, entitled "PRACTICAL APPROACH TO LAYOUT MIGRATION," and (c) U.S. Patent Application 20130019219, entitled "SYSTEM AND METHOD FOR HIERARCHY RECONSTRUCTION FROM FLATTENED GRAPHIC DATABASE SYSTEM LAYOUT."

SUMMARY

According to one embodiment of the present invention, a hierarchical "scale and bias" layout migration method migrates a source layout for fabrication in a first process to a target layout that can be fabricated at a target process without requiring a technology file or specification of design rules. A method of the present invention handles much larger circuits than those handled by previous migration methods. The target layout may be scaled using different scaling factors in the X and Y directions. The layout can also be biased (i.e., grow or shrink) in both X and Y directions. The target layout maintains the same connectivity as the source layout, thereby avoiding LVS (Layout versus Schematic) errors and is free of notches, jogs and small edges that cause DRC (Design Rule Checker) errors.

A method of the present invention analyzes the topology of a source layout to construct a cell hierarchy tree. The cell hierarchy tree links parent and children cell instances, with a root cell instance representing a top-level cell instance. Each cell instance in the cell hierarchy tree includes a cell name, a reference to a master cell, absolute or relative coordinates, a rotation orientation, and mirroring or symmetry information.

The absolute coordinates of each cell instance (relative to the origin of its top-level cell instance) are calculated. The cell instances of the cell hierarchy tree are also ordered according to their respective depths within the cell hierarchy tree. By convention, the cell instances at lower depths are of higher hierarchy orders (i.e., at numerically lesser levels), while the root cell instance has a depth of 0, which is the highest hierarchy order. This ordering helps traversing the cell hierarchy tree.

Dimensions in a layout database are typically expressed in terms of a minimum design grid unit, which may be 1 nm, 5 nm, 10 nm or any desired value, depending on the target fabrication process. All dimensions used in the database are integral multiples of the design grid unit. Another measure used in a layout system is a resolution, which is a floating point number that represents the value of a basic unit used in the database. A design grid unit is an integral multiple of the database resolution. Some plausible design resolutions are, for example, 1 nm and 0.1 nm. A layout database with a resolution of 1 nm may have, for example, a design grid unit of 5 nm. All dimensions are multiples of 5 nm. In such a system, values such as 5, 10, 15, . . . units represent on-grid positions, and values such as 2, 3, 4, 6, 7 . . . units are off-grid positions. When a dimension or a size is scaled, the resulting value is rounded to an on-grid integer value. One scaling function may be, for example:

$$X' = \text{int}(X * \text{scale}/\text{grid} + 0.5) * \text{grid}$$

where X is a source coordinate, X' is the target coordinate, scale is a scaling factor, int is a function that maps a floating point number to an integer, grid is the number of layout resolution units in a design grid unit. Other scaling functions may also be used. When the scaling function is applied within a cell instance, two elements with the same geometrical values are rounded to the same integer. Thus the scaled database within a cell instance does not exhibit any artifact that causes connectivity, notch, jog or small edges errors. Consequently, as the flat database of the target layout contains everything within the same cell instance, the resulting database is free of artifacts after scaling is performed.

According to one embodiment of the present invention, to avoid rounding errors and the resulting loss of accuracy, the database resolution may be decreased. Off-grid problems encountered during application of hierarchical scaling and bias operations (e.g., connectivity, notch, jog and small edges) can result from two sources of errors. One source of errors is grid snapping of a cell instance to X and Y coordinates. The other source of errors is grid snapping of elements within a cell instance (e.g., such as polygons, rectangles and paths). These two types of errors may be separately addressed. For example, cell instance grid snapping errors may be resolved separately from grid snapping errors of elements within cell instances.

Once the X and Y scaling factors are determined, a top-down traversal of the cell hierarchy tree is performed, during which absolute and relative coordinates for each cell instance is calculated from the source coordinates based on the X and Y scaling factors. In general, in some cell instances, absolute X or Y coordinates calculated based on expanding relative coordinates over the hierarchy and absolute based on scaling the source absolute coordinates may be different because of grid-snapping. In general, the difference is one grid unit. Resolution of such differences may result in creation of new cell masters in the hierarchical database through a process referred to as "cell splitting."

A user may provide a call-back function that determines whether or not cell splitting is required. Alternatively and by default, the system determines the need for cell splitting according to computed coordinate values. Other cell splitting criteria are also possible. In one embodiment, gate splitting criterion relates to a transistor gate alignment requirement. If the source layout does not require a regular gate pitch, but the target layout requires a regular gate pitch, more than one target cell master may be created from a source cell master, so as to allow different cell instances to abide to different gate pitch requirements. Another cell splitting requirement occurs when a planar transistor is migrated to a FinFET transistor. In that situation, requirements on transistor placement may require different target cell masters for different cell instances of the same source transistor. Where cell splitting arises out of requirements for transistor gate placement, diffusion placement and layout operations within a cell instance, for example, such requirements may be implemented in a user-supplied call-back function. In this manner, the present invention avoids flattening of the database, and allows the target database to remain hierarchical.

If there is determined a requirement for cell splitting, the cell splitting can be carried out in at least two approaches. In a first approach, the position of the cell instance to be split is modified in the scaled hierarchical database to match the corresponding position in the scaled flat database, as is required to correct grid snapping errors. The second approach requires the cell instance to be split, with at least one of the newly created cell references reference a different cell master. In the first approach, e.g., cell splitting required because of a modification of a relative position of a lower-level cell instance, a new cell master is created for the parent cell of the cell instance to be split. This approach keeps the lowest level cell instances intact (and hence obviates the need for cell splitting at a lower level). This approach also limits coordinate-based cell splitting to the top-down traversal.

In the second approach, the cell instance to be split references a different cell master. If the new cell master already exists, e.g., due to a previous encounter of the same problem in another cell instance, the present cell instance is modified to reference this pre-existing new cell master. Otherwise, a new cell master is created. This second approach would split a leaf cell, for example, and typically would result in a larger hierarchical database than the first approach.

In one preferred embodiment, the first and second approaches are used to handle different situations. The first approach handles cell splitting due to cell instance grid snapping position differences, and the second approach handles cell splitting indicated by a user-supplied call-back function.

Once all cell instances have been processed by the top-down traversal of the cell hierarchy tree, a bottom-up traversal is then performed. A cell instance is compared with properties of its cell master, including positions (i.e., coordinates) and rotation orientations of the children instances. When a difference exists, a new cell master is created. In one embodiment, the new cell master is assigned a cell name that is derived from the cell name of the source cell master. In one implementation, the new cell master is created by appending an index or a descriptive code to the name of the source cell master together with a randomly generated code (e.g., original_name_random_rotation_1, where random represents a randomly generated number). The randomly generated code avoids naming conflict. In this example, rotation encodes the rotation orientation of the cell instance, relative to the original cell master. Upon completion of the bottom-up traversal, the cell hierarchy tree is deemed properly expanded.

The target hierarchical database is expected to be larger than the source hierarchical database, in part due to creation of cell masters from source cell masters. The dimensions in the target hierarchical database are scaled according to X and Y scaling factors, which may not be the same. In one embodiment, the rotation orientation of the created target master cell indicate applying the X and Y scaling factors on the source master cell after applying the appropriate rotation orientation of the source master cell. For example, in that procedure, cell masters having rotation orientations of 0° and 180° result from applying the X and Y scaling factors on the X and Y dimensions, respectively, while cells with rotation orientations of 90° and 270° have X and Y scaling factors applied to Y and X dimensions, respectively, when the rotation orientation is taken into account.

The target database may be further modified by a user-specified bias operation (i.e., a grow or shrink operation). The target database is further processed to eliminate from each layout layer connectivity, notch, jog and small edge problems resulting from a grid snapping requirement. Each layer in the database may be migrated separately. In one embodiment, each layer of the source hierarchical database is first flattened and then scaled by applying the X and Y scaling factors and bias. The scaled flat layout layer is used as reference data, as the scaled flat database is free of connectivity, notch, jog and small edges problems. Polygons of each layer of the scaled flat database are compared by boolean operations to polygons in the corresponding layer to determine whether a difference exists between the flat and hierarchical databases. Modifications are then made to the scaled hierarchical database, with the goal of matching the hierarchical database to the flat database. In one embodiment, a first boolean operation identifies, in each layer, all polygons in the layout that are in the scaled hierarchical database and not in the scaled flat database. All related polygons are analyzed to determine whether or not the polygons need to be shrunk or moved to match the flat scaled database. Another NOT boolean operation is applied to polygons in the same layer to identify the polygons that are in the scaled flat database and not in scaled hierarchical database. Such polygons are added to the scaled hierarchical data base by including the identified polygons in the cell instance and creating a master cell for the cell instance at a higher level of the hierarchy.

An XOR (exclusive OR) operation may be performed in each layout layer to verify that the scaled hierarchical database matches the scaled flat database. The NOT operations described above may be repeated until no more differences are found between the scaled hierarchical database and the scaled flat database, or until the number of iterations reaches a user-specified limit.

The present invention is better understood upon consideration of the detailed description below in conjunction with the accompanying drawings.

DESCRIPTION OF THE PREFERRED EMBODIMENTS OF THE INVENTION

Reference is now made in detail to the preferred embodiments of the present invention. While the present invention is described in conjunction with the preferred embodiments, the preferred embodiments are not intended to be limiting the present invention. On the contrary, the present invention is intended to cover alternatives, modifications and equivalents within the scope of the present invention, as defined in the accompanying claims.

Figure 1:
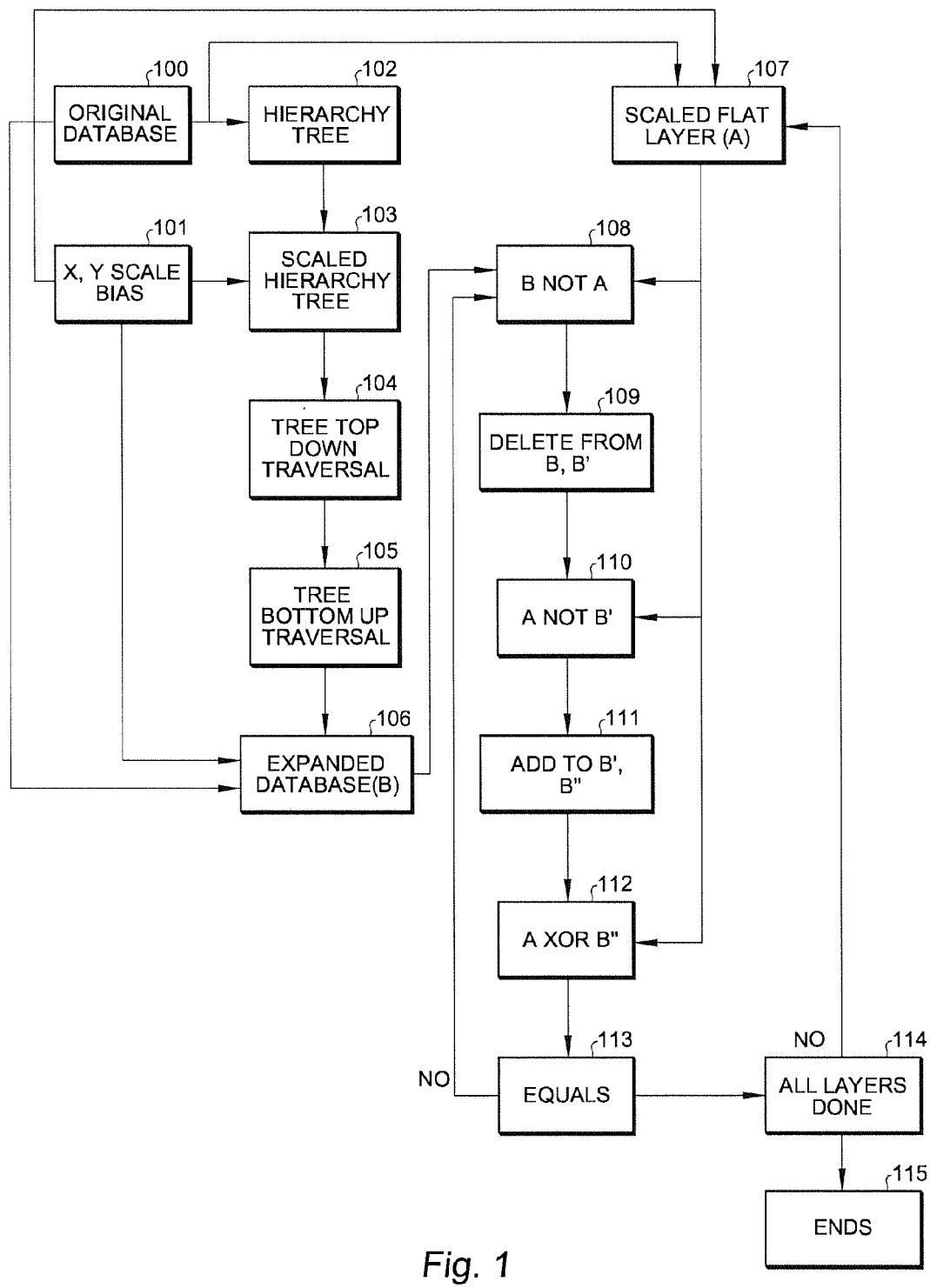
FIG. 1 is a flow diagram illustrating operations of a layout migration system, in accordance with one embodiment of the present invention.

FIG. 1 is a flow diagram illustrating operations of a layout migration system, in accordance with one embodiment of the present invention. As shown in FIG. 1, the migration process begins with source layout database 100, which may be a GDSll (Graphic Database System) file, OASIS (Open Artwork System Interchange Standard) file or a layout database such OA (Open Access) or any proprietary layout database. Also provided at the beginning of the migration are X and Y scaling factors and bias conditions (collectively, scaling and bias input data 101). Cell hierarchy tree 102 is then built from source database 100. Scaling and bias input data are then applied to the data in source database 100 guided by cell hierarchy tree 102 to provide scaled cell hierarchy tree 103 and scaled hierarchical database 120 (not shown in FIG. 1). Each layer of source database 100 is also flattened, and then scaled and biased to provide scaled flat database 107 (also referred to herein as database "A").

A top-down traversal is performed on scaled cell hierarchy tree 103. During this traversal, if a discrepancy is found between the scaled absolute coordinates (i.e., position) of a vertex of a polygon in scaled flat database 107 and the corresponding scaled absolute coordinates calculated based on cell hierarchy tree 103, cell hierarchy tree 103 is modified. A bottom-up traversal is also performed to further modify cell hierarchy tree 103. Based on source database 100, the scale and bias conditions, and modified cell hierarchy tree 103, target cell hierarchy tree 104 and corresponding target hierarchical database 106 (or database "B") are constructed.

A boolean operation "B NOT A" (step 108) is performed on each layer to identify areas of polygons in target hierarchical database 106 that fall on empty space in target flat database 107. The identified polygons of operation 108 are then eliminated from target hierarchical database 106 (step 109). Another boolean operation "A NOT B" (step 110) is then performed on each layer to identify those polygons that are in scaled flat database 107 that fall on empty space in target hierarchical database 106. The identified polygons of operation 110 are then added to target hierarchical database 106 (step 111). Finally, to verify that target hierarchical database 106 now matches target hierarchical database 107 exactly, a Boolean operation XOR (step 112) is then performed on each layer. If the XOR operation of step 112 results in any non-zero area polygon, repeat steps 108-112. Steps 108-112 may be performed layer by layer (e.g., looping a layer at a time through steps 108-114, 107). If there is no difference identified at step 112 or the number of iterations of steps 108-112 reaches a user specified limit, database migration is considered complete (step 115).

Thus, according to one embodiment of the present invention, the operations of the layout migration system described above follow the following algorithm:
(a) providing as input to the layout migration system a source circuit layout database;
(b) providing X and Y scaling factors and bias conditions for application on each layer of layout elements in the source layout database;
(c) building a cell hierarchy tree covering every cell instance in the source layout database, including calculating absolute coordinates for each cell instance in the source layout database by multiplying existing absolute coordinates to the X and Y scaling factors to obtain a first set of scaled absolute coordinates;
(d) building a first target database using the X and Y scaling factors and the bias conditions, which includes, for each cell instance:
(i) calculating a second set of scaled absolute coordinates;
(ii) comparing the second set of scaled absolute coordinates with the first set of scaled coordinates; if the first and second sets of scaled coordinates are different, referencing the second set of scaled absolute coordinates to a different cell master or changing the second set of scaled absolute coordinates to match the first set of scaled absolute coordinates;
(iii) performing a bottom-up traversal of the cell hierarchy tree to expand the cell hierarchy tree and the first target database
(e) for each layer in the database,
(i) building a second target database by flattening the source database, scaling the second target database using the X and Y scaling factors, and applying the bias conditions;
(ii) performing a NOT operation between the second target database and the first target database, so as to find elements in the first target scaled database that are not in the second target database, and removing the identified elements from the first target database;
(iii) performing a NOT operation between the second target database and the first target database, so as to find elements in the second target database that are not in the first target database, and adding the identified elements to the first target database at the highest-level cell instance that contains the added elements; and (iv) performing an XOR operation to determine whether or not the layer in the second target database and the first target database are equal; if a difference is found, repeat steps (i)-(iv) until no further difference is found, or if a iteration limit is reached; and
(f) outputting the second target database.

Figure 2A:
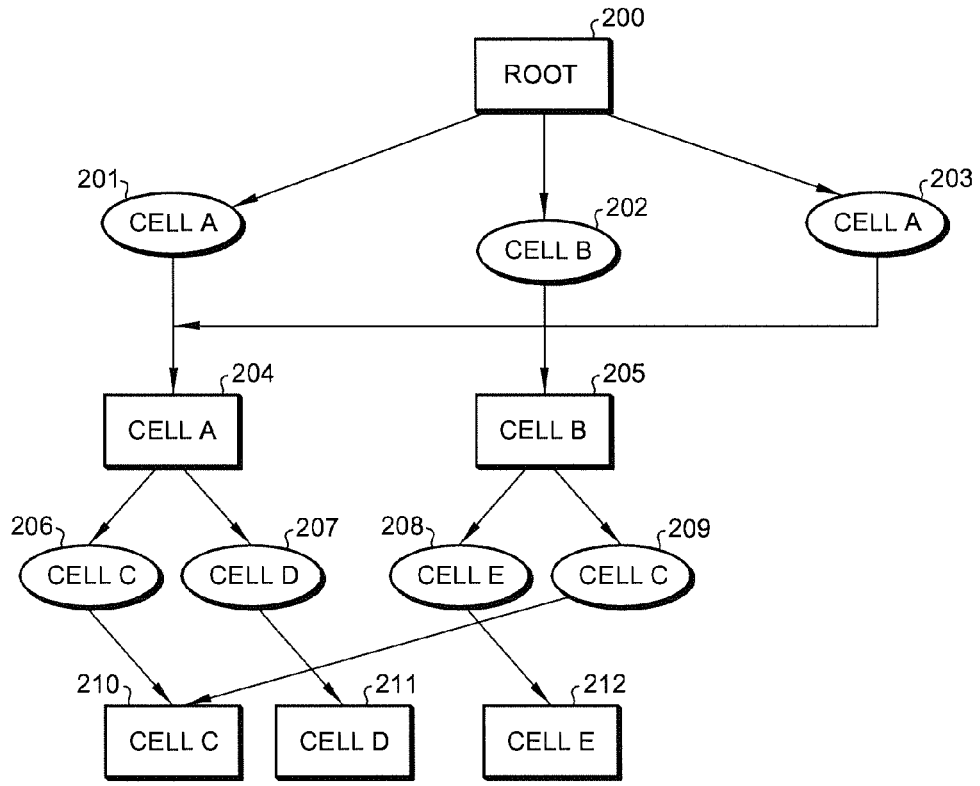
FIGS. 2A and 2B show the structures of a hierarchical database and a cell hierarchy tree, respectively, in accordance with one embodiment of the present invention.
Figure 2B:
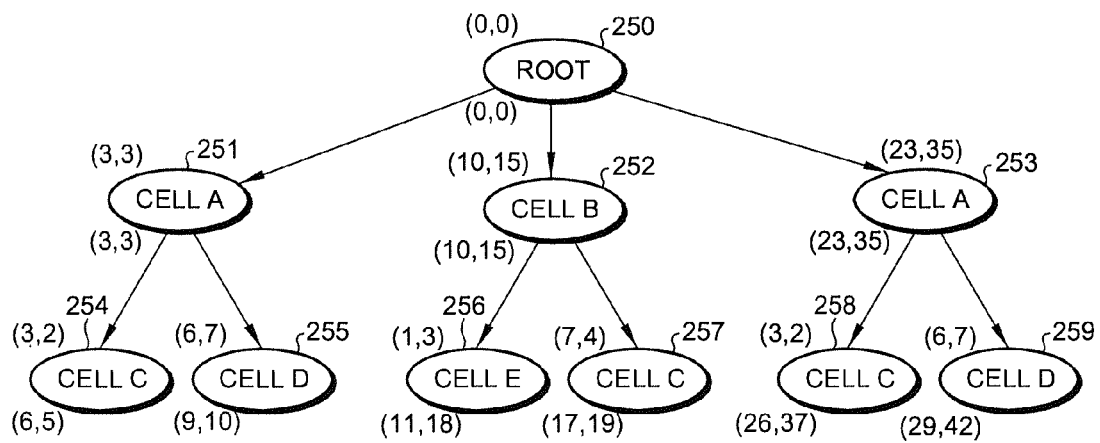

FIGS. 2A and 2B show the structures of a hierarchical database and a cell hierarchy tree, respectively, in accordance with one embodiment of the present invention. To simplify the design process and layout complexity, modern layout file formats or databases typically use a hierarchical data structure. Generally, a hierarchical data structure is organized by layer and, within each layer, by "cells." Each cell may be formed out of elements which may be one or more other lower-level cells, one or more polygons, or both. A lower-level cell is referred to as a "subcell" when it is referred to relative to a higher level cell. In this detailed description, the term "cell instance" refers to a data record representing deployment of a cell in a layout or a cell master. A cell master, also known as a cell definition file, defines a cell. In a hierarchical database, the cell instance references its cell master, rather than actually reproducing the elements in the data record of the cell master. In a cell instance implemented by more than one instance of a subcell, all instances of the subcell references the same cell definition file or cell master.

In FIG. 2A, a rectangle box represents a cell master and an elliptical box represents a cell instance. For example, root 200 is the top cell definition, which includes cell instances 201-203. As shown in FIG. 2A, cell instances 201 and 203 are instances of cell A, which is defined in cell master 204. Similarly, cell instance 202 is an instance of cell B, which is defined by cell master 205. Cell master 204, in turn, includes cell instances 206 and 207, corresponding to cells C and D, which are defined respectively in cell masters 210 and 211, respectively. Cell master 205 for cell B includes cell instances 208 and 209, corresponding to cells E and C, respectively. Cell instances 208 references its cell master 212, and cell 209 references cell master 210. In the hierarchical database of FIG. 2A, the cell instances are not expanded. For example, cell instances 201 and 203 are each an instance of cell A, which includes cell instances 206 and 207 of subcells C and D. In this representation, cell instances 201 and 203 each implicitly include a set of cell instances 206 and 207. In other words, the two sets of cell instances 206 and 207 in cell instances 201 and 203 are not duplicated. Thus, because there is no duplication, the size of the hierarchical database is greatly reduced relative to a flat database.

As shown in FIG. 2B, a cell hierarchy tree, unlike a hierarchical database, is fully expanded. In other words, every cell instance is explicitly represented in a cell hierarchy tree. In this embodiment, a cell instance in the cell hierarchy tree includes the name of the cell, cell instances of subcells referenced, X and Y coordinates of each referenced cell instance ("relative coordinates", which are relative to the origin of the cell instance), absolute coordinates of the cell instance ("absolute coordinates", which are relative to the origin of the top cell instance), rotation orientation of each subcell instance, mirror or symmetry information, absolute coordinates of the cell instance after scaling, and any other suitable information. In FIG. 2B, each cell instance includes the relative coordinates at top left and the absolute coordinates at bottom left. For example, cell instance 254 (cell C) shows relative coordinate (3,2) and absolute coordinates (6,5). In FIG. 2B, root instance 250 contains cell instance 251 (cell A) at relative coordinate (3,3), cell instance 252 (cell B) at relative coordinates (10,15) and cell instance 253 (cell A) at relative coordinates (23, 35). As the relative coordinates of each of cell instances 251, 252 and 253 are relative to root cell instance 250, their respective absolute coordinates and relative coordinates are the same. Cell instance 251 contains cell instance 254 (cell C), at relative coordinates (3,2) and absolute coordinates (6,5), and cell instance 255 (cell D), at relative coordinates (6,7) and absolute coordinates (9,10). Cell instance 252 (cell B) contains cell instance 256 (cell E), at relative coordinates (1,3) and absolute coordinates (11,18), and cell instance 257 (cell C), at relative coordinates (7,4) and absolute coordinates (17,19). Cell instance 253 (cell A) contains cell instance 258 (cell C) at relative coordinates (3,2) and absolute coordinates (26,37), and cell instance 259 (cell D) at relative coordinates (6,7) and absolute coordinates (29,42). This implementation facilitates cell hierarchy expansion in the later stage of the algorithm. Since the cell hierarchy tree only stores cell instance data records (i.e., not including the polygons), even for a very large database, the cell hierarchy tree requires only a modest amount of memory space.

Figure 3A:
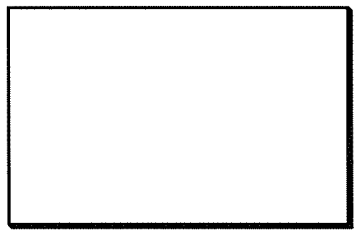
FIG. 3A illustrates scaling in a layout that uses the same scaling factor of 0.7 in both X and Y directions, according to one embodiment of the present invention.
Figure 3A:
Figure 3B:
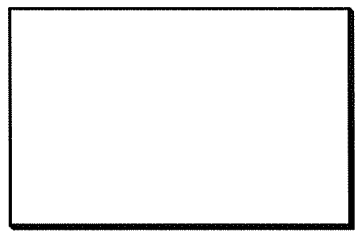
FIG. 3B illustrates scaling in a layout that uses different scaling factors 1.0 and 0.5 in the X and Y directions, respectively, according to one embodiment of the present invention.
Figure 3B:
Figure 3C:
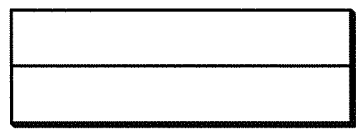
FIG. 3C illustrates scaling a path using scaling factors of 0.5 in the X and Y directions, and a size_scale factor of 0.5, according to one embodiment of the present invention.
Figure 3C:

FIG. 3A illustrates scaling in a layout that uses the same scaling factor of 0.7 in both X and Y directions. FIG. 3B illustrates scaling in a layout that uses different scaling factors 1.0 and 0.5 in the X and Y directions, respectively. As only the dimensions within the same cell are modified, scaling may be accomplished by a flat scaling. The following equations calculate the new coordinates:

$$X'=\text{int}(X*x\_scale/grid+0.5)*grid$$

$$Y'=\text{int}(Y*y\_scale/grid+0.5)*grid$$

where X and Y are the original coordinates, X' and Y' are the scaled coordinates, x_scale and y_scale are the scaling factors in the X and Y directions, respectively. The function int rounds a floating point number into an integer, the value grid represents the minimum layout resolution (also referred to as "design grid"). Similar functions, such as floor, ceiling or other variations, may also be used to convert a floating point number into an integer. Other scaling factors can also be used to scale size-related parameters (e.g., the width of a path). A path, which is defined by vertices and a width, typically defines wires in layout. To scale a path, path vertices are multiplied by the X and Y scaling factors, and the width is scaled using a separate parameter size_scale. Typically, the width of a path is an even number after scaling. FIG. 3C illustrates scaling a path using scaling factors of 0.5 in the X and Y directions, and a size_scale factor of 0.5. The following equation scales the width of a path:

$$width'=2*\text{int}(width*size\_scale*0.5/grid+0.5)*grid$$

where "width" is the width in the source database and "width'" is the scaled width.

Figure 4A:
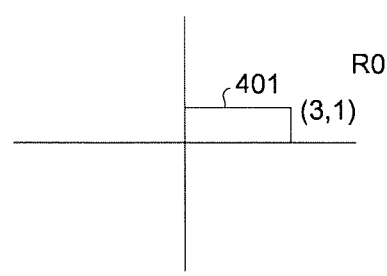
FIGS. 4A-4H show various rotations, mirroring and symmetry transformations used in a layout database, according to one embodiment of the present invention.
Figure 4B:
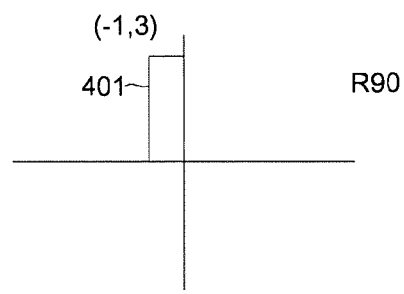
Figure 4C:
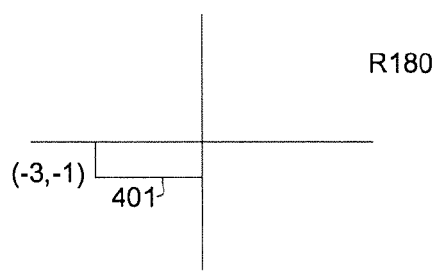
Figure 4D:
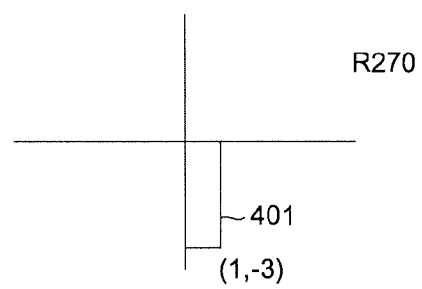
Figure 4E:
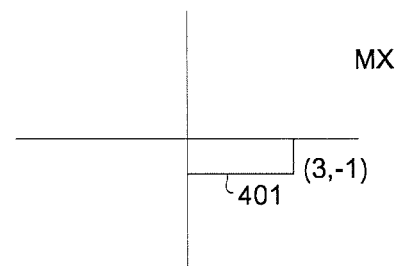
Figure 4F:
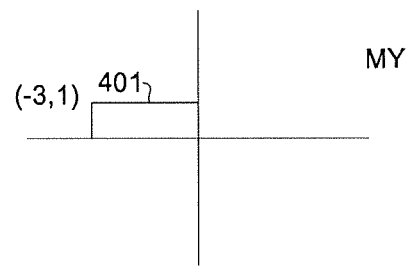
Figure 4G:
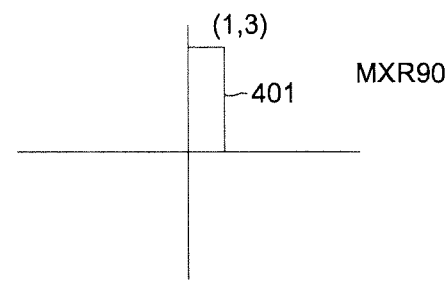
Figure 4H:
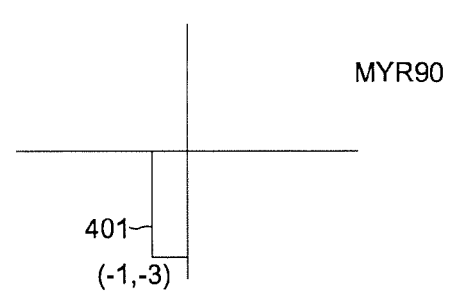

FIGS. 4A-4H show various rotations, mirroring and symmetry transformations used in a layout database. FIG. 4A shows polygon 401 in a layout database before rotation (i.e., R0 orientation) or mirroring, having a reference vertex at (3,1). FIG. 4B shows polygon 401 being rotated 90° (i.e., R90 orientation), such that the reference vertex is now at (−1,3). FIG. 4C shows polygon 401 being rotated 180° (i.e., R180 orientation), such that the reference vertex is now at (−3,−1). FIG. 4D shows polygon 401 being rotated 270° (i.e., R270 orientation), such that the reference vertex is now at (1,−3). (In this description, unless expressly provided, all rotations are anticlockwise rotations.) FIG. 4E illustrates an MX symmetry transformation (i.e., mirroring about the X axis), where the mirrored reference vertex is at (3,−1). FIG. 4F illustrates an MY symmetry transformation (i.e., mirroring about the Y axis), where the reference vertex is at (−3,1). FIG. 4G shows a MXR90 transformation (i.e., an MX symmetry transformation, followed by a 90° rotation), placing the reference vertex to (1,3). FIG. 4H shows a MYR90 transformation (i.e., an MY symmetry transformation, followed by a 90° rotation), placing the reference vertex at (−1,−3). Other combinations of rotation and symmetry transformations are also possible.

Figure 5:
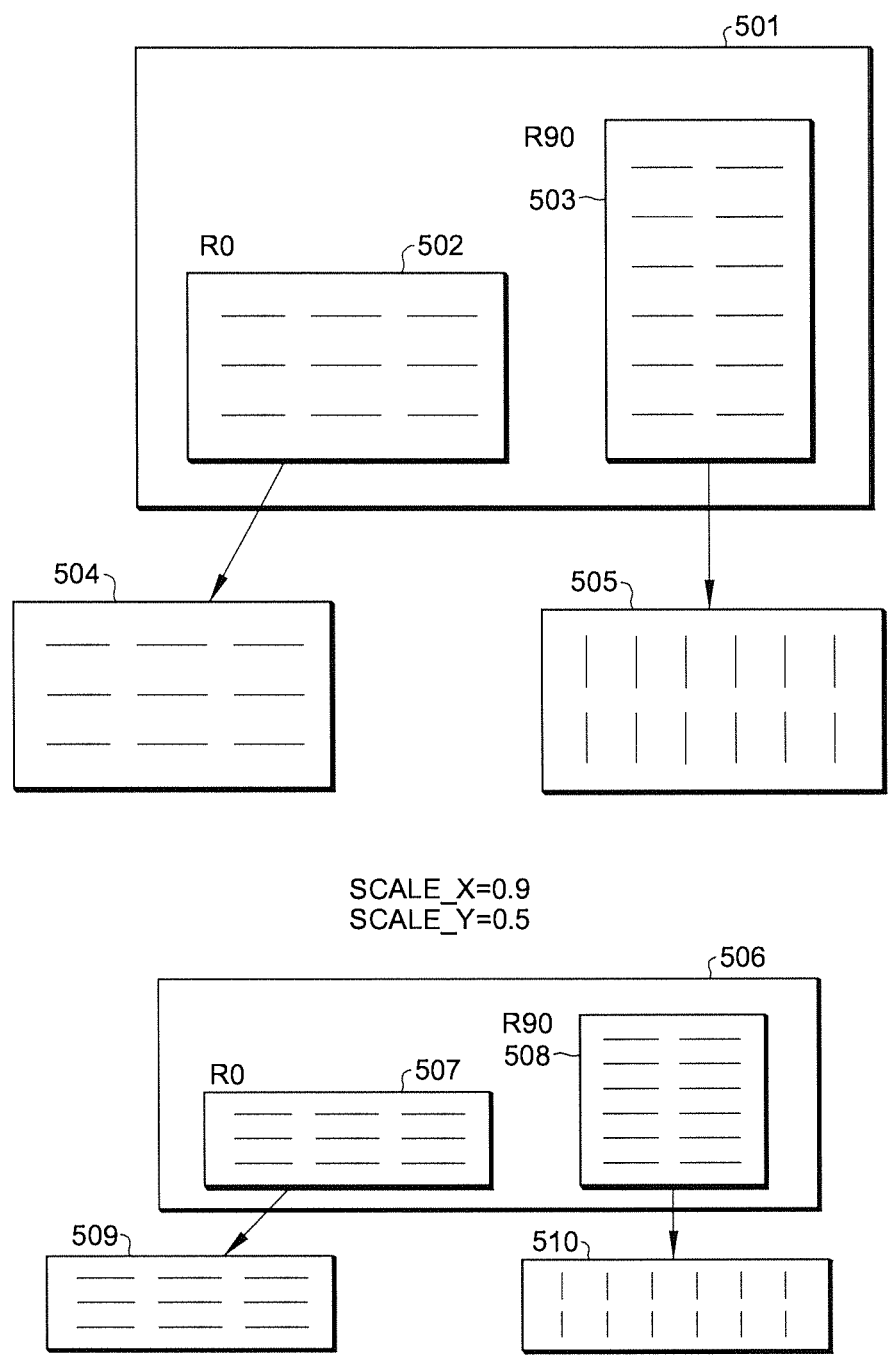
FIG. 5 illustrates an example of hierarchically scaling using different X and Y scaling factors on cell instances at different rotation orientations, according to one embodiment of the present invention.

FIG. 5 illustrates an example of hierarchically scaling using different X and Y scaling factors on cell instances at different rotation orientations. As shown in FIG. 5, top level cell instance 501 includes cell instance 502 and cell instance 503 in R0 and R90 orientations, respectively. Cell instance 502 references a cell master 504 (i.e., cell master 504) at R0 orientation. Similarly, cell instance 503 references a cell master 505 (i.e., cell master 505) at R90 orientation. By applying a hierarchical scaling using an X scaling factor of 0.9 and a Y scaling factor of 0.5, top-level cell instance 501 results in top-level cell instance 506, which includes scaled cell instance 507 and scaled cell instance 508. Scaled cell 507 now references cell master 509, which results from scaling cell master 504 using an X scaling factor of 0.9 and a Y scaling factor of 0.5. Similarly, cell instance 508 references cell master 510, which results from scaling cell master 505 using X scaling factor of 0.5 and Y scaling factor of 0.9. As seen from FIG. 5, the rotation orientations of the cell instances are maintained in the data structure of the scaled database. In general, for cell rotation orientations R0 or R180, the X and Y scaling factors are applied directly. For rotation orientations R90 or R270, X and Y scaling factors are interchanged to map the scaling to the orientations of the cell instances. When a cell master is referenced by both cell instances at rotation orientation R0 or R180 and cell instances at rotation orientation R90 or R270, two scaled cell masters are created from the original cell master. One scaled cell master, which is to be referenced by cells instances with R0 or R180, is obtained by applying the X and Y scaling factors directly. The other scaled cell master, which is to be referenced by cells at rotation orientations R90 or R270, are scaled using interchanged X and Y scaling factors.

Figure 6:
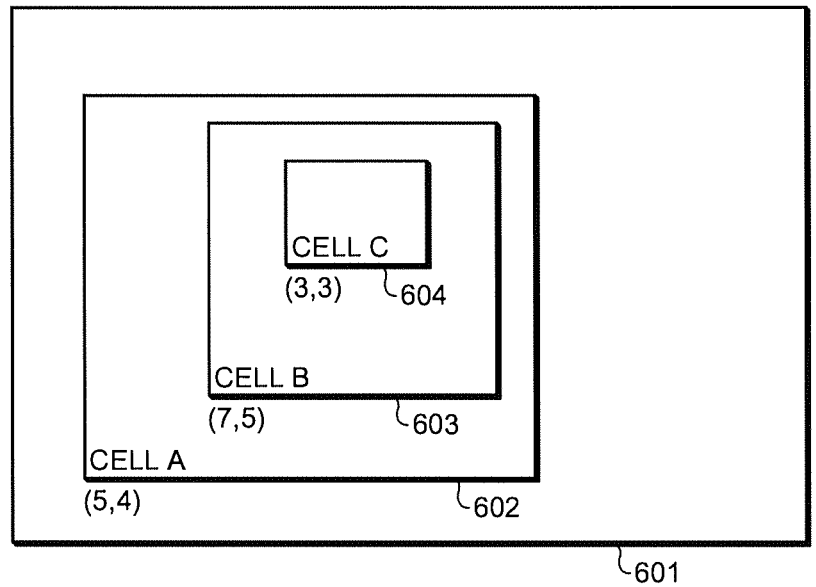
FIG. 6 shows an example of handling differences in coordinates between the scaled flat database and the scaled hierarchical database, according to one embodiment of the present invention.
Figure 6:
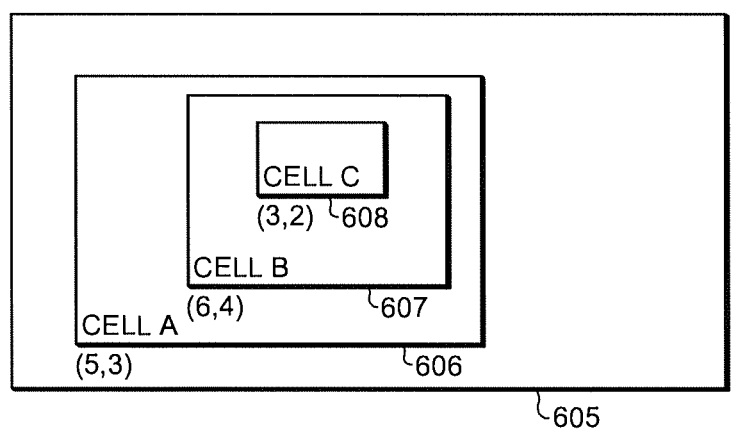

FIG. 6 shows an example of handling differences in coordinates between the scaled flat database and the scaled hierarchical database. The layout in the upper half of FIG. 6 represents the source hierarchical database, while the layout in the bottom half of FIG. 6 represents the corresponding target scaled hierarchical database. As shown in FIG. 6, top level cell instance 601 includes cell instance 602 (cell A) at (5,4). Cell instance 602 includes cell instance 603 (cell B) at (7,5), relative to the origin of cell A. Cell instance 603 includes cell instance 604 (cell C) at (3,3), relative to the origin of cell B. In this example, distances are provided in nm and the design grid is 1 nm. Thus, flattening the hierarchical database, absolute coordinates X and Y of cell instance 604 are:

$$X=5+7+3=15$$

$$Y=4+5+3=12$$

The scaling factors in the X and Y directions are:

$$scale\_x=0.9$$

$$scale\_y=0.7$$

Thus, scaled absolute coordinates X' and Y' of cell instance 604 in the scaled flat database are $$X'=\text{int}(15*0.9+0.5)=14$$

$$Y'=\text{int}(12*0.7+0.5)=8$$

Referring to the scaled hierarchical database, top level cell instance 605 includes cell instance 606 (cell A) at coordinates (5, 3). Cell instance 606 includes cell instance 607 (cell B) at (6, 4), relative to the origin of cell A. Cell instance 607 includes cell instance 608 (cell C) at (3, 2), relative to the origin of cell B. Scaled absolute coordinates X" and Y" coordinates of cell instance 607 are:

$$X''=\text{int}(5*0.9+0.5)+\text{int}(7*0.9+0.5)+\text{int}(3*0.9+0.5)=5+6+3=14$$

$$Y''=\text{int}(4*0.7+0.5)+\text{int}(5*0.7+0.5)+\text{int}(3*0.7+0.5)=3+4+2=9$$

Thus, the absolute coordinates (14,8) in the scaled flat database differs from the absolute coordinates (14,9) in the scaled hierarchical database. This difference results from rounding coordinates to integer values in the scaled hierarchical database.

Figure 7A:
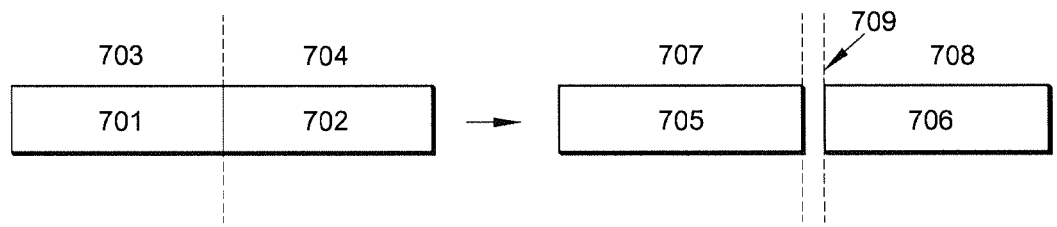
FIGS. 7A-7D illustrate how problems relating to connectivity, jogs, notches and small edges may arise in the scaled layout due to hierarchical scaling, according to one embodiment of the present invention.

FIGS. 7A-7D illustrate how problems relating to connectivity, jogs, notches and small edges may arise in the scaled layout due to hierarchical scaling. As shown in FIG. 7A, rectangular wires 701 and 702 are polygons within cell instances 703 and 704, which abut each other. After scaling, gap 709 arises between scaled rectangles 705 and 706 due to a rounding difference between scaled cell instances 707 and 708. Gap 709 is a connectivity problem, which is likely to be reported in an LVS check and in a DRC check.

Figure 7B:
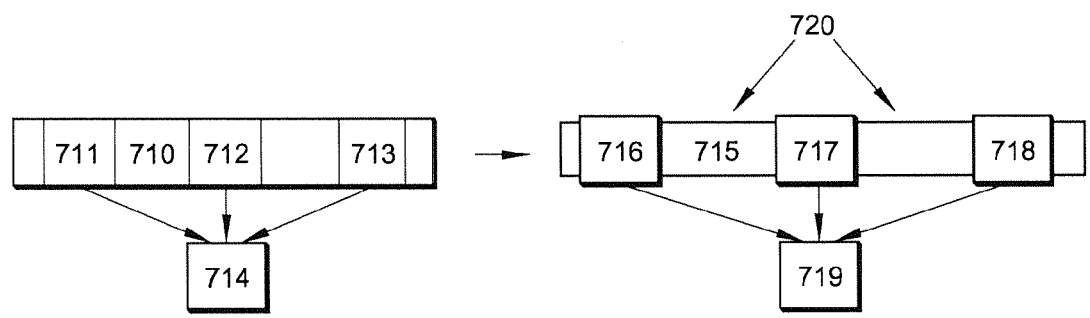

FIG. 7B shows rectangular wire 710, which abuts edges of cell instances 711, 712 and 713. Cell instances 711, 712 and 713 each reference cell master 714, which is a via cell master that contains square via and wire elements. Cell instances 711, 712 and 713 each have edges that either abut or are collinear with an adjacent rectangular wire. After scaling, however, edges of wire 715 are no longer collinear with edges of scaled cell instances 716, 717 and 718. (Cell instances 716, 717 and 718 each reference cell master 719.) The edges of rectangle 715 and the edges of cell instances 716, 717 and 718 are no longer collinear. For example, the edges of cell instances 716, 717 and 718 now extend outside the edge of wire 715. These edges create notches indicated by reference numeral 720. The notches are treated as errors in a DRC check.

Figure 7C:
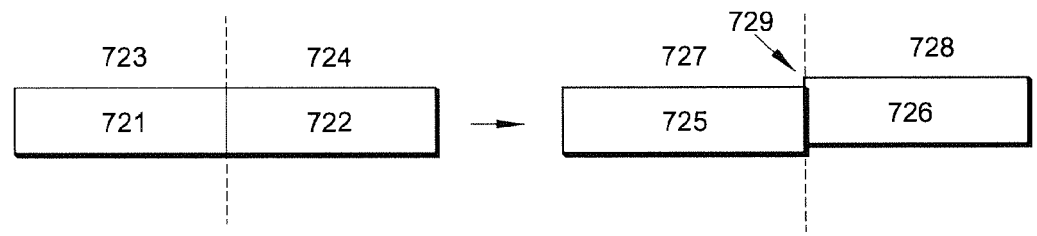

FIG. 7C shows rectangular wires 721 and 722 belonging to cells instances 723 and 724, which abut each other. After scaling, scaled cell instances 727 and 728 result, and which still abut each other. However, the edges between rectangular wires 725 and 726 are no longer collinear, due to a rounding error between cell instances 727 and 728, creating a "jog," 729 which may be detected as an error in a DRC check.

Figure 7D:
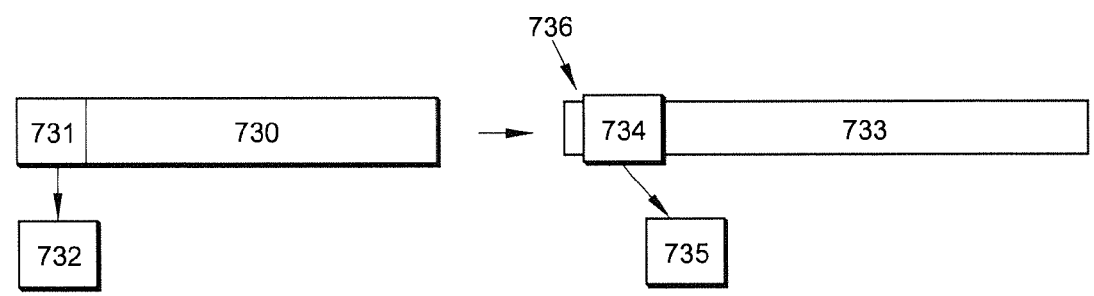

FIG. 7D shows rectangular wire 730 and cell instance 731, which references cell master 732. Cell master 732 is a via cell master that includes square via and wire polygons. The edges of the rectangular wire 730 and edges of a wire polygon within the via cell master abut. Wire 730 and cell instance 731 are scaled to provide wire 733 and cell instance 734, which reference cell master 735. The edges of wire 733 and the edges of wire element in cell instance 734 are no longer collinear, thereby creating small edges 736, which may be result in errors in a DRC check.

Figure 8A:
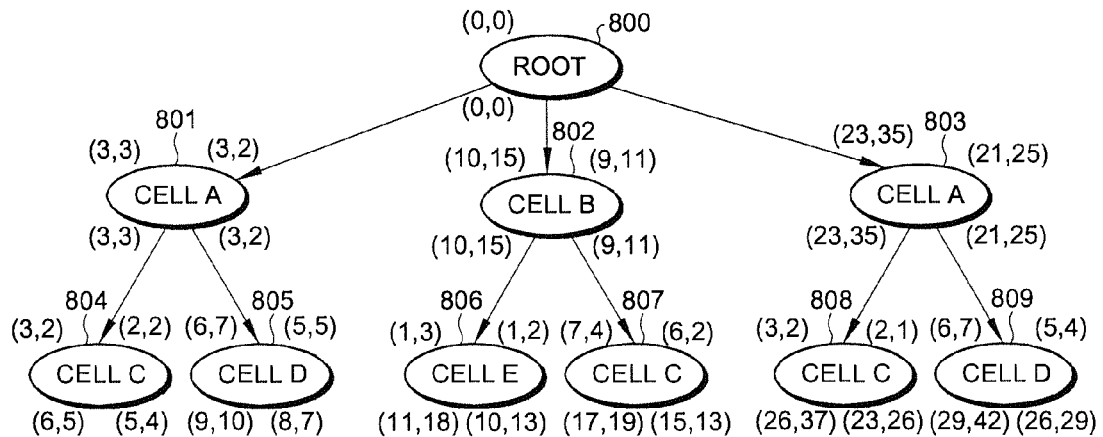
FIGS. 8A and 8B illustrate scaling of a hierarchical database, based on traversing a cell hierarchy tree using the top-down and bottom-up search steps of an algorithm according to one embodiment of the present invention.
Figure 8B:
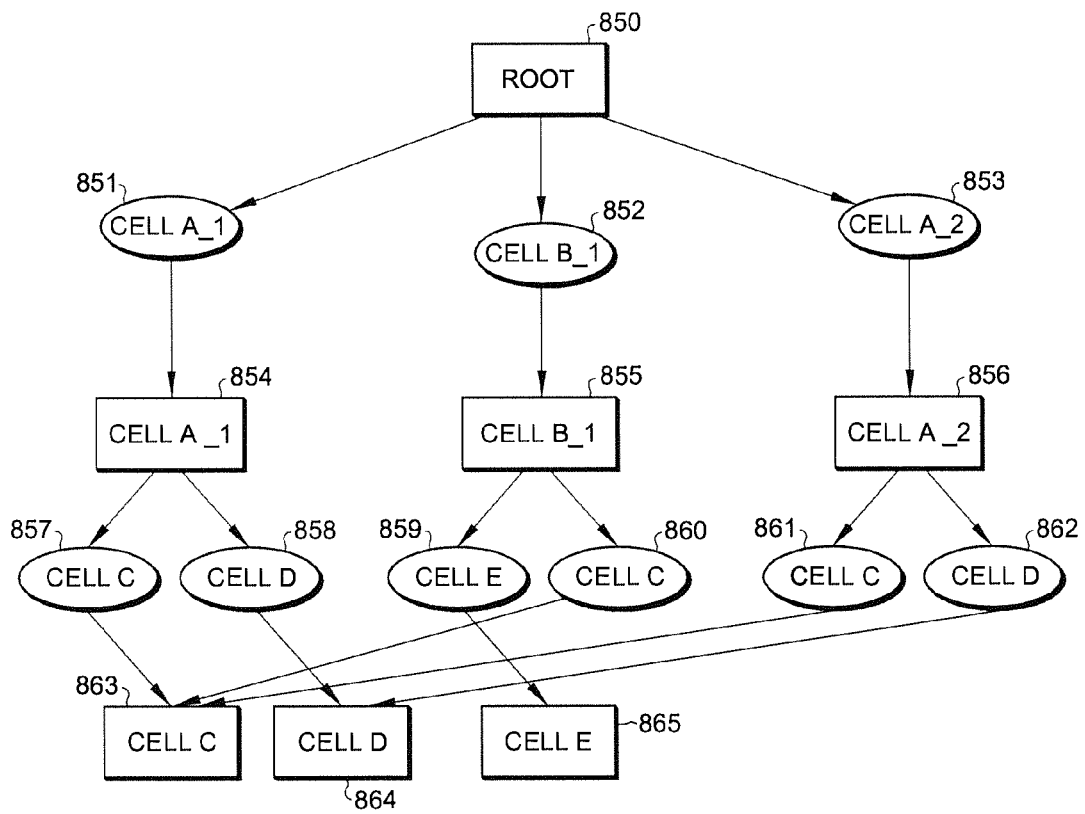

FIGS. 8A and 8B illustrate scaling of a hierarchical database, based on traversing a cell hierarchy tree using the top-down and bottom-up steps in the algorithm described above. FIG. 8A is based on the same hierarchical database and the cell hierarchy tree of FIGS. 2A and 2B. The scaled absolute and relative coordinates may be calculated based on a top-down traversal of the cell hierarchy tree. Applying an X scaling factor of 0.9 and a Y scaling factor of 0.7, scaled flat absolute coordinates are computed for all cell instances of the cell hierarchy tree. In FIG. 8A, which illustrates the cell hierarchy tree for the hierarchical database, four sets of coordinates are associated with each cell instance. The absolute coordinate before scaling are provided at bottom-left, relative coordinates before scaling are provided at top-left, scaled absolute coordinates are provided at bottom-right, and scaled relative coordinates are provided at top-right.

Referring to cell instances at level 1 of FIG. 8A, for cell instance 801 (cell A), pre-scaling absolute coordinates are (3,3) and post-scaling absolute coordinates are (3,2). For cell instance 802 (cell B), pre-scaling absolute coordinates are (10,15) and post-scaling absolute coordinates are (9,11). Similarly, for cell instance 803 (cell A), pre-scaling absolute coordinates are (23,35) and post-scaling absolute coordinates are (21,25). Referring to cell instances at level 2 of FIG. 8a, for cell instance 804 (cell C), pre-scaling absolute coordinates are (6,5) and post-scaling absolute coordinates are (5,4). For cell instance 805 (cell D), pre-scaling absolute coordinates are (9,10) post-scaling absolute coordinates are (8,7). Cell instance 806 (cell E), pre-scaling absolute coordinates are (11,18) and post-scaling absolute coordinates are (10,13). For cell instance 808 (cell C), pre-scaling absolute coordinates are (26,37) and post-scaling absolute coordinates are (23,26). For cell instance 809 (cell D), pre-scaling absolute coordinates are (29,42) and post-scaling absolute coordinates are (26,29).

For level 1 cell instances of FIG. 8A, the absolute and relative coordinates are the same, as both coordinates are provided relative to the origin of root cell instance 800. For level 2 cells, the scaled relative coordinates may be computed by subtracting the scaled absolute coordinates from the scaled absolute coordinates of the parent instance. Thus, the scaled relative coordinates for cell instance 804 are (2,2), being the difference between (5,4) and (3,2). For cell instance 805 the scaled relative coordinates are (5,5), being the difference between (8,7) and (3,2). For cell instance 806, the scaled relative coordinates are (1,2), being the difference between (10,13) and (9,11). For cell instance 807, the scaled relative coordinates are (6,2), being the difference between (15,13) and (9,11). For cell instance 808, the scaled relative coordinates are (2,1), being the difference between (23,26) and (21,25). For cell instance 809, the scaled relative coordinates are (5,4), being the difference between (26,29) and (21,25).

A bottom-up traversal of the cell hierarchy tree of FIG. 8A allows associating each cell instance of the cell hierarchy tree to a cell master, which is illustrated in FIG. 8B. According to one embodiment of the present invention, both the coordinates and a user-provided call-back function are used to create the cell master. The process includes determining whether or not to create more than one scaled cell master from the pre-scaling cell master (i.e., a process described as "splitting the cell master"). Bottom-up traversal begins at the lowest level or leaf cell instances. A lowest level cell instance may reference a new cell master, if the call-back function determines that the cell master is to be split. Alternatively, when a call-back function is not provided, or if the call-back function does not call for splitting the cell master, cell instance coordinates are then examined to determine cell splitting.

In general, and as shown FIG. 8B, the cell masters of lowest level cell instances (e.g., cell instances 857-862) in level 2, i.e., cell masters 863-865 for cell C, cell D and cell E, respectively, need not be split. With respect to cell instance 801 (cell A) of level 1, prior to scaling, cell instance 801 references a pre-scale cell master A, which includes a cell instance of cell C at relative coordinates (3,2) and a cell instance of cell D at pre-scaled relative coordinates (6,7). Thus, scaling the cell master results in post-scaled relative coordinates for cell C and D at (3,1) and (5,5), respectively, in one instance. However, applying scaling at cell instance 801, results in scaled relative coordinates for cell instance 804 and 805 at (2,2) and (5,5), respectively. The scaled coordinates for cell C and cell D in the cell master of cell A are different from the scaled coordinates for specific cell instance 801 of cell A. Thus, in the hierarchical database, a new cell master needs to be created for cell A. Cell master 854 (i.e., cell master A__1) is thus created with scaled relative coordinates of included cell C at (2,2) and cell D at (5,5). Cell master A__1 derives from the original cell master of cell A. Accordingly, in the hierarchical database root cell master 850 references cell instance 851, which references in turn cell master 854. The same process is applied to cell instance 802 (cell B), which references cell instance 806 at relative coordinates of (1,3) and cell instance 807 at relative coordinates (7,4), thus providing scaled relative coordinates at (1,2) for cell instance 806, and scaled relative coordinates (6,2) for cell instance 807. Scaling of the master cell for cell B, however, results in scaled relative coordinates (1,2) for included cell E and scaled relative coordinates (6,2) for included cell C. Thus, a new cell master B__1 is created and cell instance 852 is created to replace cell instance 802. Cell instance 852 references cell master 855 (cell B__1). Similarly, in cell instance 803, scaled relative coordinates for referenced cell instance 808 at (2,1) and cell instance 809 at (5,6) are different from both cell master A and cell master A__1. Accordingly, a new cell master A__2 (cell master 856) is created, which includes cell instance 861 for cell C at relative coordinates (2,2) and cell instance 862 for cell D at relative coordinates (5,6). After the bottom-up traversal of the cell hierarchy tree, a new hierarchical database results (FIG. 8B). Compared with the hierarchical database of FIG. 2A, the hierarchical database of FIG. 8B is greatly expanded as a result of cell splitting. Even with the expansion, the resulting hierarchical database is still far smaller than a flat database.

Figure 9:
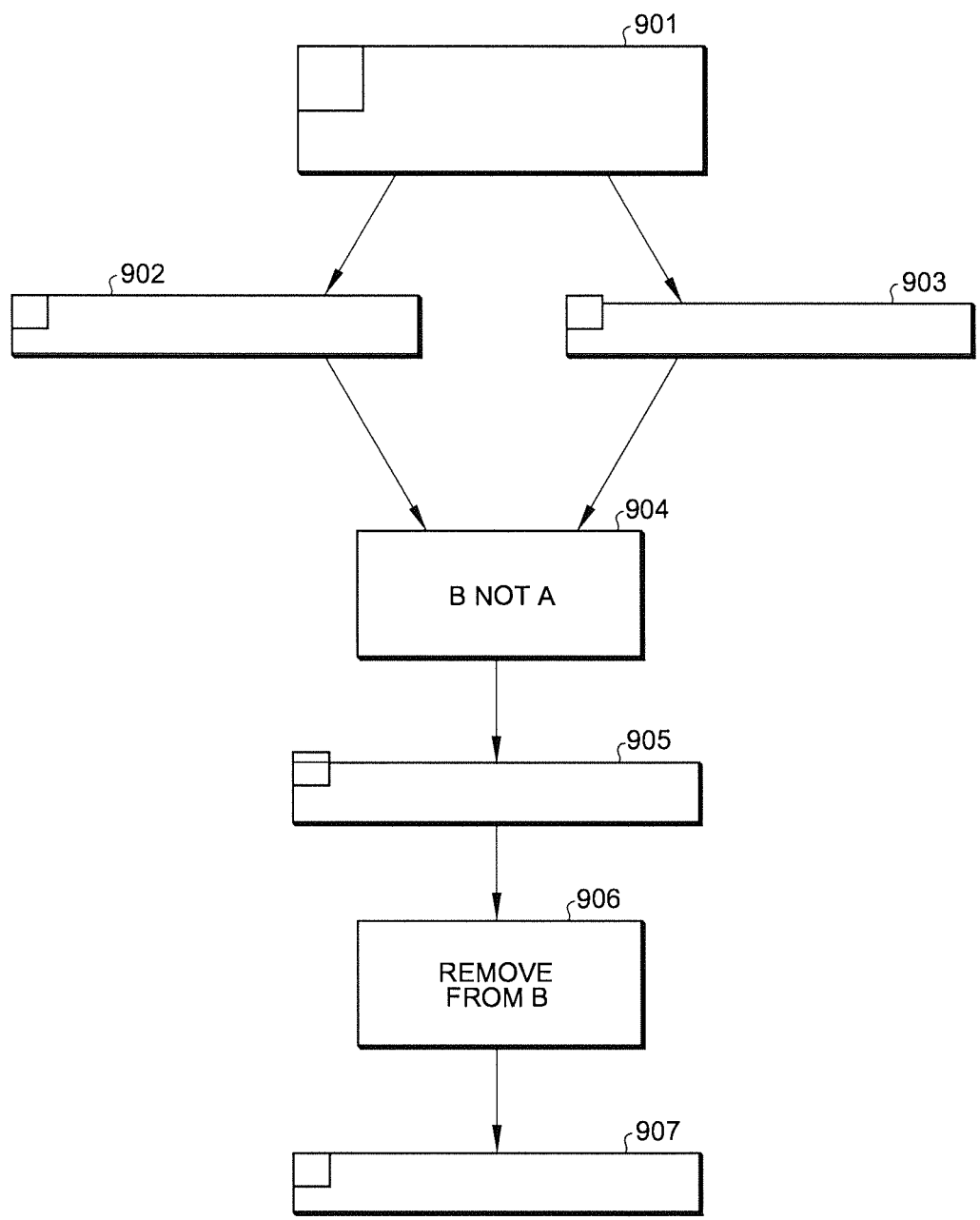
FIG. 9 illustrates operation of steps 108 and 109 of FIG. 1, in accordance with one embodiment of the present invention.

FIG. 9 illustrates operation of steps 108 and 109 of FIG. 1, in accordance with one embodiment of the present invention. As shown in FIG. 9, element 901 represents the original layout, which includes a wire and a via cell that have collinear edges. After applying the hierarchical scale and bias operations, layout 903 result in the hierarchical database. In layout 903, the wire and the via cell are no longer collinear because of rounding error in the cell master for the via cell. At the same time, scaling and bias operations are performed in the scaled flat database to provide layout 902, which maintains the collinear edges in the wire and the via cell instance. NOT boolean operation 904 is then performed between flat scaled database and the hierarchical scaled database, which identifies the portions of the polygons which exist in the scaled hierarchical database but not in the scaled flat database. The identified portion is shown shaded in layout 905. A logical removal operation 906 is then performed to remove the identified portion from the scaled hierarchical database (e.g., by creating a new via cell master). The resulting layout 907 in the scaled hierarchical database now has the collinear edges in the wire and the via cell instance.

Figure 10:
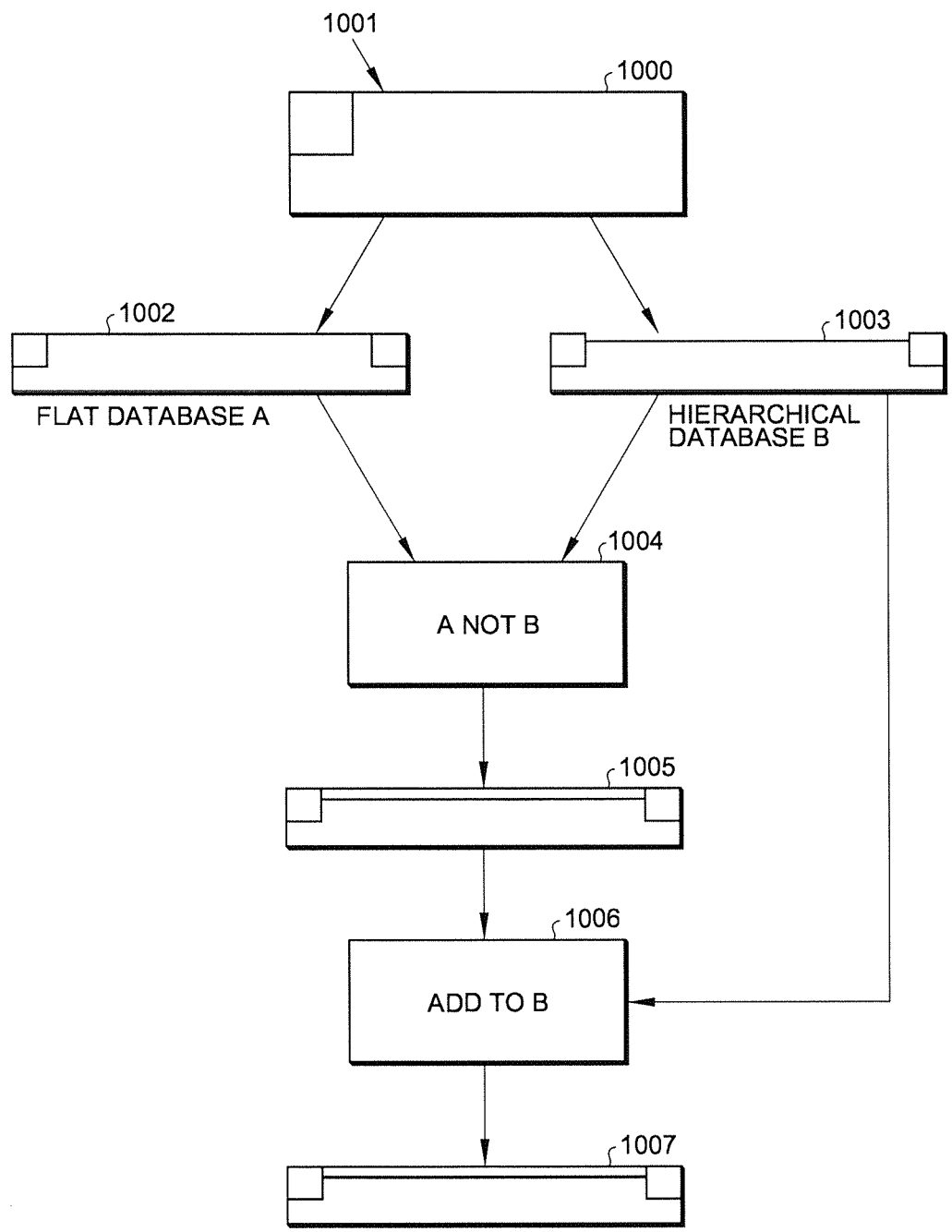
FIG. 10 illustrates operation of steps 110 and 111 of FIG. 1, in accordance with one embodiment of the present invention.

FIG. 10 illustrates operation of steps 110 and 111 of FIG. 1, in accordance with one embodiment of the present invention. As shown in FIG. 10, layout 1001 includes a wire 1000 and two via cell instances at opposite ends of the wire. Both via cell instances reference the same cell master. After performing scaling and biasing, resulting layout 1002 has the wire and the cell instances share collinear edges. At the same time, hierarchical scaling and biasing performed in the hierarchical database results in layout 1003, in which the wire and the via cell instances are no longer collinear. NOT boolean operation 1004 is then carried out to identify portions of the polygons which are present in the scaled flat database and not in the scaled hierarchical database. The identified portion is shown as shaded in the layout 1005. Logical operation 1006 is then performed to include the shaded portion at the highest hierarchical level. The results of logical operation 1006 is layout 1007, which includes the scaled wire, the newly added polygon, and the scaled via cell instances. The added polygon provides collinear edges with the via cell instances.

The detailed description herein is provided to illustrate specific embodiments of the present invention and is not intended to be limiting. Numerous modifications and variations within the scope of the invention are possible. The present invention is set forth in the following claims.

I claim:

1. A computer-implemented method for creating a target hierarchical layout for an integrated circuit based on a source hierarchical layout, each hierarchical layout comprising a plurality of layers, cell instances and polygon, comprising:
   receiving by a computer-aided design (CAD) tool running on a computer scaling factors and bias values in X and Y directions for each layer in the source layout;
   creating by the CAD tool on the computer a source cell hierarchy tree based on the source hierarchical layout;
   based on the source cell hierarchy tree, creating by the CAD tool on the computer a target cell hierarchy tree by scaling each cell instance in the source hierarchical layout to provide a corresponding cell instance in the target cell hierarchy tree using the scaling factors in the X and Y dimensions;
   comparing positions of cell instances in the source cell hierarchy tree to positions of corresponding cell instances in the target cell hierarchy tree and modifying the target cell hierarchy tree to conform to the source cell hierarchy tree; and
   based on the target cell hierarchy tree, creating by the CAD tool on the computer the target hierarchical layout by applying the bias values on each layer of the target hierarchical layout.

2. The computer-implemented method of claim 1, wherein the bias values are different for each layout layer.

3. The computer-implemented method of claim 1, wherein different bias values are applied in the X and Y directions.

4. The computer-implemented method of claim 1, wherein comparing is performed in conjunction with a top-down traversal of the target cell hierarchy tree.

5. The computer-implemented method of claim 1, wherein creating the target hierarchical layout further comprises providing in each cell instance in the target hierarchical layout a reference to a corresponding cell master.

6. The computer-implemented method of claim 5, wherein one or more of the corresponding cell masters in the target hierarchical layout are created from corresponding cell masters in the source hierarchical layout when positions of cell instances in the source cell hierarchy tree are different from positions of corresponding cell instances in the target cell hierarchy tree.

7. The computer-implemented method of claim 5, wherein separate cell masters are created for cell instances in the target hierarchical layout.

8. The computer-implemented method of claim 7, wherein separate cell masters are created in the target hierarchical layout from a common source cell master in the source hierarchical layout based on rotation orientation or mirroring state of cell instances.

9. The computer-implemented method of claim 8, wherein cell instances having rotation orientations that are odd multiples of 90° and cell instances having rotation orientations that are even multiples of 90° are provided separate cell masters.

10. The computer-implemented method of claim 5, wherein one or more of the corresponding cell masters in the target hierarchical layout are created from corresponding cell masters in the source hierarchical layout based on a determination performed by calling a user-provided call-back function.

11. The computer-implemented method of claim 10, wherein the user-provided call-back function determines one or more cell-splitting criteria affecting layout in a target process.

12. The computer-implemented method of claim 11, wherein the one or more criteria relate to cell internal transistor gate or diffusion placement.

13. The computer-implemented method of claim 10, wherein the user-provided call-back function is called in conjunction with a bottom-up traversal of the target cell hierarchy tree.

14. The computer-implemented method of claim 1, wherein, in conjunction with creating the target hierarchical layout, the cell hierarchy tree is first traversed top-down and then traversed bottom-up.

15. The computer-implemented method of claim 1, further comprising:
    flattening the source hierarchical layout;
    scaling the flattened source hierarchical layout by applying the scaling factors and bias conditions in the X and Y directions to obtain a target flattened target layout;
    comparing the target flat layout with the target hierarchical layout and accordingly modifying the target hierarchical layout.

16. The computer-implemented method of claim 15, wherein modifying the target hierarchical layout removes one or more of the following artifacts: broken connection, notches, jogs and small edges caused by rounding differences across layout hierarchy.

17. The computer-implemented method of claim 15, wherein the comparing is performed using one or more boolean operations.

18. The computer-implemented method of claim 17, wherein the boolean operations include a NOT operation that identifies layout elements in the target hierarchical layout that is not in the target flat layout.

19. The computer-implemented method of claim 18, further comprising eliminating the identified layout elements from the target hierarchical layout.

20. The computer-implemented method of claim 17, wherein the boolean operations include a NOT operation that identifies layout elements in the target flat layout that is not in the target hierarchical layout.

21. The computer-implemented method of claim 20, further comprising incorporating the identified layout elements into the target hierarchical layout.

22. The computer-implemented method of claim 21, wherein the elements are incorporated at the highest level of the target cell hierarchy tree which contains elements abutting the identified layout elements.

23. The computer-implemented method of claim 17, wherein the boolean function comprise an XOR function for verifying the identity of elements between the target flat layout and the target hierarchical layout.

24. The computer-implemented method of claim 1, wherein the scaling factors in the X and Y directions are different.

25. The computer-implemented method of claim 1, wherein the target cell hierarchy tree instantiates every cell instance and keeps track of relative and absolute coordinates of the cell instances, rotation orientations and symmetry or mirror states.

26. The computer-implemented of claim 1, wherein the source hierarchical layout is provided as one of: a layout file or a layout database.

* * * * *